United States Statutory Invention Registration [19]

[11] Reg. Number: H395

Nash

[43] Published: Dec. 1, 1987

[54] PROCESS FOR MEASURING THE ELECTRICAL PROPERTIES OF LIQUIDS AND GRANULAR SUBSTANCES

[75] Inventor: Thomas F. Nash, Hunstville, Ala.

[73] Assignee: The United States of America as represented by the Secretary of the Army, Washington, D.C.

[21] Appl. No.: 70,770

[22] Filed: Jun. 24, 1987

[51] Int. Cl.[4] ..... G01R 27/04; G01R 27/26

[52] U.S. Cl. ..... 324/58.5 B; 324/61 P

*Primary Examiner*—Stephen C. Buczinski
*Assistant Examiner*—Linda J. Wallace
*Attorney, Agent, or Firm*—John C. Garvin, Jr.; Freddie M. Bush; Robert L. Broad

[57] ABSTRACT

A process for determining the electrical characteristics of a material wherein a probe is inserted into the material and an electrical pulse is transmitted to generate a reflected wave which will have a shape which will depend on the electrical characteristics of the material. The probe used has coaxial inner and outer conductors, with an exposed one of the inner conductor extending beyond the outer conductor to establish an electric field between the exposed end of the inner conductor and the outer surface of the outer conductor when an electrical pulse reaches the end of the probe.

3 Claims, 3 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PROCESS FOR MEASURING THE ELECTRICAL PROPERTIES OF LIQUIDS AND GRANULAR SUBSTANCES

DEDICATORY CLAUSE

The invention described herein may be manufactured, used, and licensed by or for the government for governmental purposes without the payment to me of any royalties thereon.

BACKGROUND OF THE INVENTION

1. Field of the Invention

This invention relates to processes for determining the electrical properties of materials.

2. Prior Art

It is known to determine the electrical properties of a material by inserting a probe into the material and transmitting electrical pulses to the probe to generate a reflected wave which is attenuated by the material. The reflected wave can be displayed and observed, with the configuration of the reflected wave indicating the electrical properties of the material being tested.

Two types of probes are commonly used for determining the electrical properties of materials. In one type, the probe is made up of a pair of parallel conductors spaced a predetermined distance apart. The disadvantage of this kind of probe is that the two conductors must always be maintained in a parallel relationship and the distance between the probes must remain constant from use to use.

The other type of probe is made up of a tubular outer conductor and inner conductor coaxial with the outer conductor, with an air space between the two conductors. The material to be tested is inserted into the tubular conductor to surround the inner conductor. The disadvantages of this system are that is not always easy to insert the material into the tubular conductor and it is almost always difficult to be sure that there is a minimum of air in the material after it is inserted into the tubular conductor.

SUMMARY OF THE INVENTION

A process for determining the electrical characteristics of a material wherein a probe is inserted into the material and an electrical pulse transmitted to the probe to develop a reflected wave which is attenuated by the electrical characteristic of the material being tested. The probe is made up of a tubular outer conductor and an inner conductor coaxial with the outer conductor, the space between the conductors being filled with an insulating substance. The inner conductor extends beyond the outer conductor and the insulating substance to leave a portion of the inner conductor exposed so that, when an electrical pulse is transmitted to the probe, an electric field is established between the exposed portion of the inner conductor and the outer surface of the outer conductor.

DETAILED DESCRIPTION OF THE INVENTION

Figure 1:
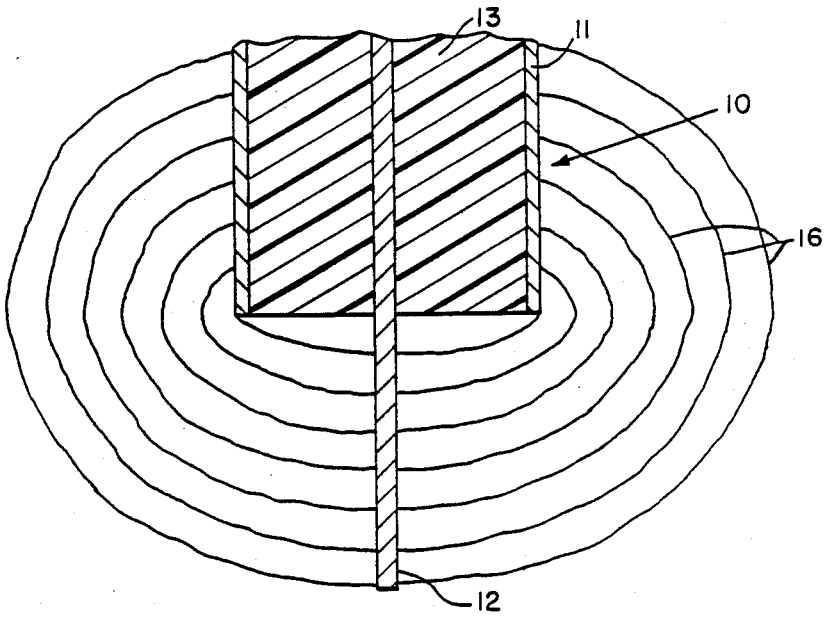
FIG. 1 is a greatly enlarged fragmentary crosssectional view of the probe used in the process of this invention.

Referring now in detail to the drawing, there is shown in FIG. 1 a probe 10 which is used in carrying out the process of this invention. This probe is made up of an outer tubular conductor 11 and an inner conductor 12 coaxial with the outer conductor 11. The space between the conductors 11 and 12 is filled with an insulating substance 13. The outer conductor 11 and the insulating substance 13 terminate short of the end of the inner conductor 12 to leave a portion of the inner conductor 12 exposed.

When an electrical pulse or wave is transmitted to the end of the probe, an electric field, indicated in FIG. 1 by reference numeral 16, will be established between the exposed portion of the inner conductor 12 and the outer surface of the outer conductor 11. With the probe inserted into the material to be tested, this material will affect the electric field in such a manner that the wave reflected back from the end of the probe will be different from the wave which would be reflected in the case where the probe is surrounded by air.

Figure 2:
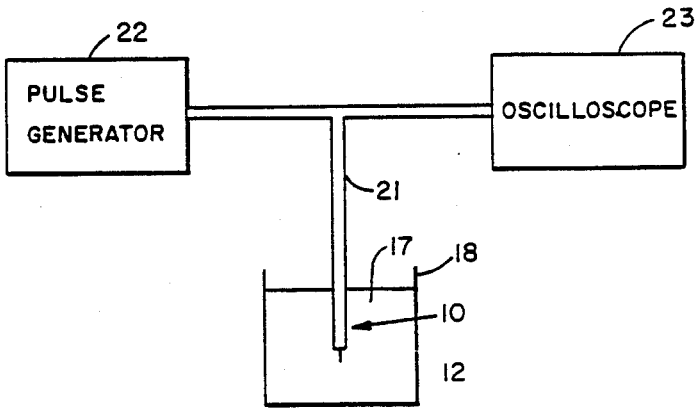
FIG. 2 is a schematic view of equipment used to carry out the process of the present invention.

FIG. 2 shows the apparatus used with a probe shown in FIG. 1. The probe is inserted into a material 17 in a container 18 and is connected by a coaxial cable 21 to a pulse generator 22 and oscilloscope 23. Both the pulse generator 22 and the oscilloscope 23 are conventional.

The pulse generator 22 transmits an electrical pulse or wave along the coaxial cable 21 to the probe 10 to generate a reflected wave which will be transmitted back from the probe 10. The reflected wave reaches the oscilloscope 23 where it is displayed for observation.

Various electrical characteristics of the material 17 can be determined. Conductivity is one electrical characteristic of a material which may be of interest. For most materials, conductivity is relatively low and for insulating materials conductivity is essentially zero. The inductive characteristics of a material are sometimes of interest. However, since most materials are non-magnetic, the inductive characteristics of these materials will be essentially equal to that of free space. The relative capacitance or permitivity of the material 17 is most easily determined by the process of this invention.

Figure 3:
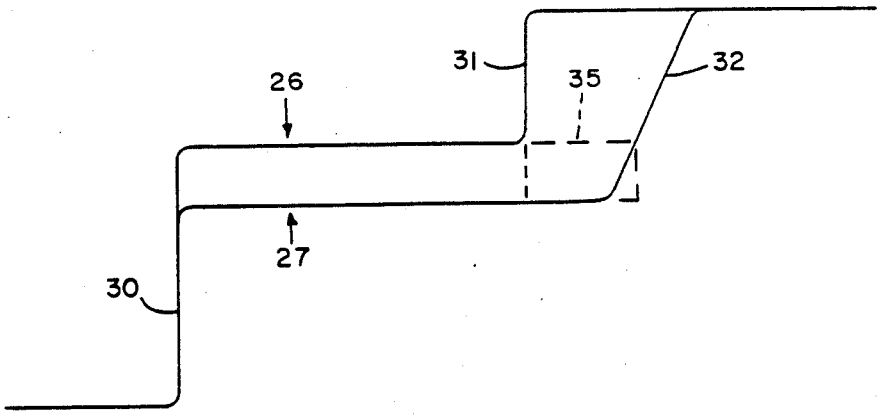
FIG. 3 is a view showing a comparison between the configurations of waves reflected back from the probe when the probe is in air and when it is inserted in the material to be tested.

FIG. 3 shows the configurations of reflected waves generated by a square wave transmitted to the probe 10 from the pulse generator 22 when the probe is in air and in a material to be tested. In the practice of this invention it is preferred that the waves or pulses transmitted to the probe 10 be either square or have a very steep wave front.

Reference numeral 26 represents the configuration of the reflected wave where the probe 10 is in air, while reference numeral 27 represents the configuration of the reflected wave when the probe 10 is inserted into a material to be tested. The first abrupt rise in the amplitude of the reflected waves 26 and 27, indicated by reference numeral 30, is generated when the wavefront reaches the end of the tubular outer conductor 11. A second increase in the amplitude of the reflected wave occurs when the transmitted wave reaches the end of the inner conductor 12. These amplitude increases in the reflected waves 26 and 27 are indicated by reference numerals 31 and 32, respectively.

It will be noted from FIG. 3 that the initial amplitude increase in the reflected wave 27 (with the probe 10 in a material 17) is different from the amplitude increase in the reflected wave 26 (with the probe 10 in air). The reason for this is that the capacitance of the material 17 is not the same as the capacitance of air. It will also be noted that the second amplitude increases in the reflected waves 26 and 27, indicated by reference numerals 31 and 32, respectively do not occur at the same point in time. The reason for this is also that the capacitances of air and the material 17 are different.

When both the initial difference in amplitude and the time difference in amplitude and the time difference between the second increase in amplitude of the waves 26 and 27 are considered, a rectangular area, outlined in dashed lines and indicated by reference numeral 35, represents the difference in capacitance between air and the material 17. By callibrating the system using materials having known capactances, the area of the rectangle 35 can be used to calculate the capacitance of the material being tested. Such calculations are known to those skilled in the art.

When the probe 10 is inserted into a material to be tested, as shown in FIG. 2, it is preferred that the depth of insertion be at least three times the length of the exposed end of the inner conductor 12. It is most preferred that the depth of insertion be at least four times the length of the exposed end of the inner conductor 12. By inserting the probe to this depth, a major portion of the electric field 16 will pass through the material to achieve more accurate results.

While it is preferred to insert the probe to several times the length of the exposed end of the inner conductor 12, it is possible to use this process by inserting only the exposed end of the inner conductor 12 into the material to be tested. This method would be used, for example, when it is desired to test the soil extending over a plot of land. Instead of digging up soil samples from various locations across the plot, the exposed end of the inner conductor 12 is inserted into the ground at the various locations and the test is run. A sharp instrument such as an awl or ice pick may be used to punch a hole into which the conductor 12 may be inserted.

When this approach is used, the probe should be inserted each time to the point where the end of the outer conductor 12 and the insulation 13 are in contact with the material to be tested. This will give consistent results from test to test.

Additional information in the electrical properties of the material is obtained by comparing the slopes of amplitude increases 31 and 32 of FIG. 3. The change in slope indicates how much power or energy is lost in the material and approximately the frequency range where the loss of power or energy occurs. This data giving the power or energy less is obtained using well known and established digital signal processing techniques including differential and Fourier transform calculations.

I claim:

1. A process for determining the electrical characteristics of a material, comprising a. inserting a probe into the material, said probe being made up of a tubular outer conductor and an inner conductor coaxial with the outer conductor, said conductors being separated by a layer of insulating substance, said outer conductor and insulated substance terminating short of the end of the inner conductor to leave a portion of the inner conductor exposed, b. transmitting an electrical pulse along the probe to establish an electrical field between the exposed portion of the inner conductor and the outer surface of the outer conductor and generate a reflected wave attenuated by the electrical characteristics of the material, and c. displaying the reflected wave to observe said attenuation.

2. The process in claim one wherein the probe is inserted into the material at the depth of at least 3 times the length of said exposed portion of inner conductor.

3. The process of claim one wherein the probe is inserted into the material to the depth of at least 4 times the length of said exposed portion.

* * * * *